Figure 1:
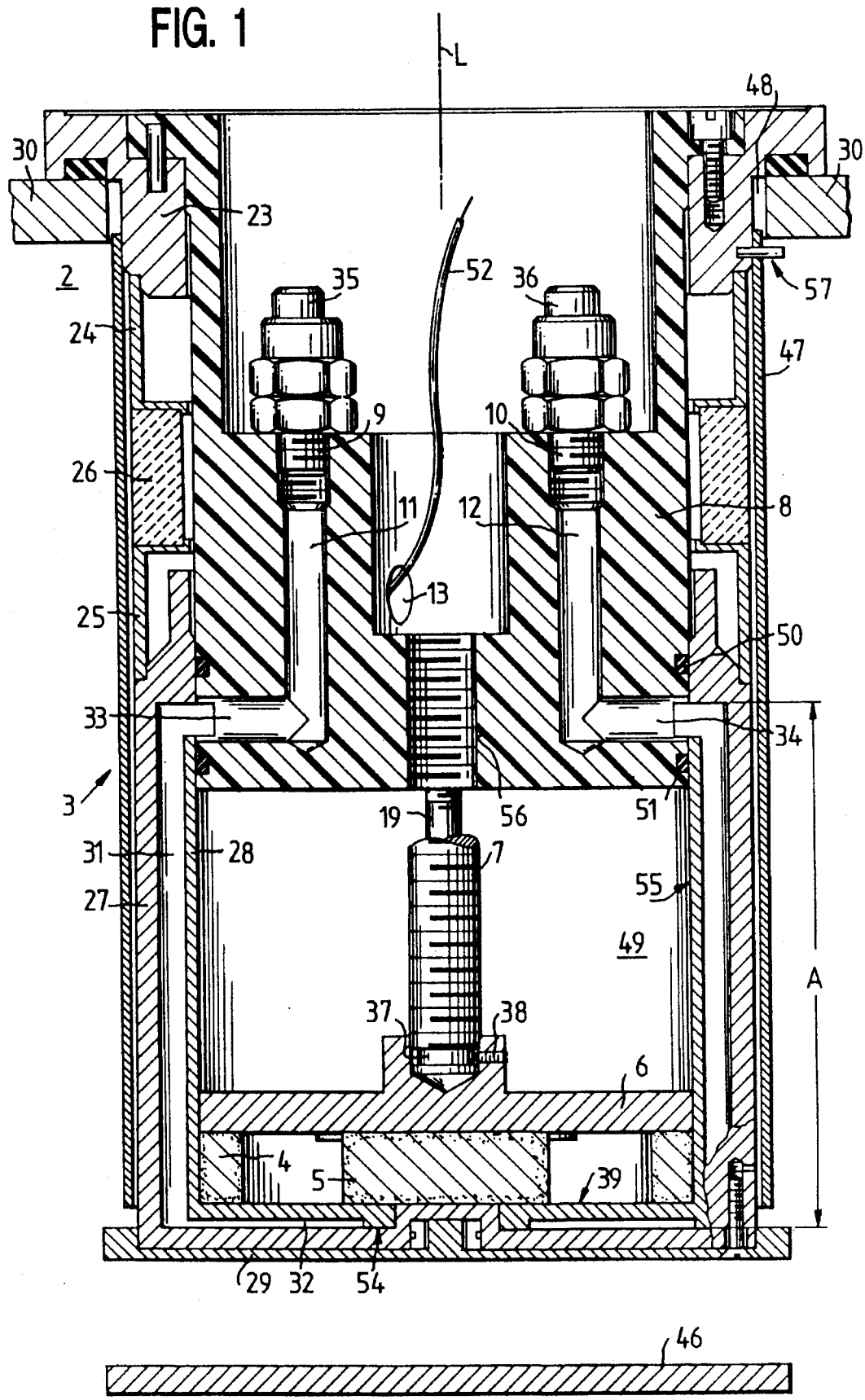

United States Patent [19]
Wolf et al.

[11] Patent Number: 5,482,610
[45] Date of Patent: Jan. 9, 1996

[54] CATHODE FOR COATING A SUBSTRATE

[75] Inventors: Bernd Wolf, Hanau; Juergen Mueller, Frankfurt am Main; Hans Neudert, Freigericht, all of Germany

[73] Assignee: Leybold Aktiengesellschaft, Hanau, Germany

[21] Appl. No.: 20,361

[22] Filed: Feb. 22, 1993

Related U.S. Application Data

[63] Continuation-in-part of Ser. No. 838,578, Feb. 19, 1992, abandoned.

[30] Foreign Application Priority Data

Nov. 14, 1991 [DE] Germany ............................ 41 37 483.5
Dec. 28, 1991 [DE] Germany ............................ 41 43 135.9

[51] Int. Cl.⁶ .................................................. C23C 14/34
[52] U.S. Cl. ............................... 204/298.19; 204/298.09; 204/298.11; 204/298.2
[58] Field of Search .......................... 204/298.09, 298.12, 204/298.19, 298.2, 192.12, 298.11

[56] References Cited

U.S. PATENT DOCUMENTS

| | | | |
|---|---|---|---|
| 4,169,031 | 9/1979 | Brors | 204/192 R |
| 4,198,283 | 4/1980 | Class et al. | 204/298 |
| 4,340,462 | 7/1982 | Koch | 204/298 |
| 4,426,264 | 1/1984 | Münz et al. | 204/192 R |
| 4,727,293 | 2/1988 | Asmussen et al. | 315/111.41 |
| 4,734,183 | 3/1988 | Wirz et al. | 204/298 |
| 4,810,346 | 3/1989 | Wolf et al. | 204/298 |
| 4,927,513 | 5/1990 | Schultheiss et al. | 204/192.13 |
| 5,006,219 | 4/1991 | Latz et al. | 204/298.16 |

FOREIGN PATENT DOCUMENTS

| | | |
|---|---|---|
| 0334347 | 9/1989 | European Pat. Off. . |
| 3047113 | 7/1982 | Germany . |
| 3727901 | 3/1989 | Germany . |
| 3800449 | 7/1989 | Germany . |
| 3812379 | 10/1989 | Germany . |
| 3920834 | 2/1991 | Germany . |
| 4100291 | 10/1991 | Germany . |
| 0104476 | 6/1984 | Japan . |
| 0215485 | 12/1984 | Japan . |
| 0142764 | 6/1987 | Japan . |
| 0028921 | 1/1989 | Japan . |
| 0119666 | 2/1989 | Japan . |
| 2298263 | 12/1990 | Japan . |

OTHER PUBLICATIONS

Yoshiro Niimura; Masahiko Naoe: Sputter deposition of Co–Cr thin–film media on high–speed rotating disk. In: J. Vac. Sci. Technol. A5 (2) Mar./Apr. 1987, pp. 191–195.

Matsuoka, M.: et al: Preparation of ba–ferrite films for perpendicular magnetic recording by RF targets facing type of sputtering. In: IEEE Transactions on Mangetics, vol. MAG–20, No. 5, Sep. 1984, pp. 800–802.

*Primary Examiner*—Nam Nguyen
*Attorney, Agent, or Firm*—Felfe & Lynch

[57] ABSTRACT

In a cathode system for coating a substrate (46), having a cathode which is connected to a direct-current and/or alternating-current source (high-frequency source) and is disposed in an evacuable coating chamber (2), and is electrically connected to a target (29) which is sputtered and whose sputtered particles deposit themselves on the substrate, a process gas is brought into the coating chamber. The cathode is formed from a substantially pot-like housing (3) whose solid bottom (39) is fixedly joined to the target (29) and whose open end facing away from the target (29) is sealingly held in an opening (49) in the outer wall (30) of the coating chamber such that the interior (49) of the housing (3) is exposed to atmospheric pressure, while the target (29) and the outer surface of the shell-like part of the housing (3) joined thereto are affected by the pressure prevailing in the coating chamber.

15 Claims, 5 Drawing Sheets

CATHODE FOR COATING A SUBSTRATE

This application is a continuation-in-part of application Ser. No. 838,578, filed Feb. 19, 1992 now abandoned.

BACKGROUND OF THE INVENTION

The invention relates to a cathode for coating a substrate, which is connected to a direct-current and alternating-current source (high-frequency source) and is disposed in an evacuable coating chamber which is electrically connected to a target that is sputtered and its sputtered particles deposit themselves on the substrate and a process gas can be brought into the coating chamber.

SUMMARY OF THE INVENTION

The present invention provides a sputtering cathode which can be disposed in or on the coating chamber such that its magnet system is accessible-replaceable for example-even when the coating chamber is evacuated, the cooling system being such that, in case of leakage in the cooling system, no coolant can penetrate into the coating chamber. It is to be one which will require much less space than a conventional cathode, and whose magnet system will be adjustable in its distance from the target even during the coating process. It is to be able to operate in an ultra-high vacuum (UHV) process at temperatures of about 200° to 400° C., and its cooling system is to be configured such that the cooling passages and cooling chambers will be close to the outer jacket throughout and will thus make an optimum cooling performance possible.

The cathode is formed of a substantially pot-shaped housing whose solid bottom is affixed at its outside face to the target and whose open end facing away from the target is held sealingly in an opening in the outside wall of the coating chamber so that the interior of the housing is exposed to atmospheric pressure while the target is subject to the pressure that prevails in the coating chamber.

An insert which at least partially fills the interior of the housing and can be locked to the inner wall of the housing such that it forms with the bottom an approximately cylindrical space into which a magnet set with yoke can be inserted.

BRIEF DESCRIPTION OF THE PREFERRED EMBODIMENT

FIG. 1 is a longitudinal section through the sputtering cathode with target screwed on and through a plane (section C—C in FIG. 4), showing the cooling passage and the coolant connections.

Figure 2:
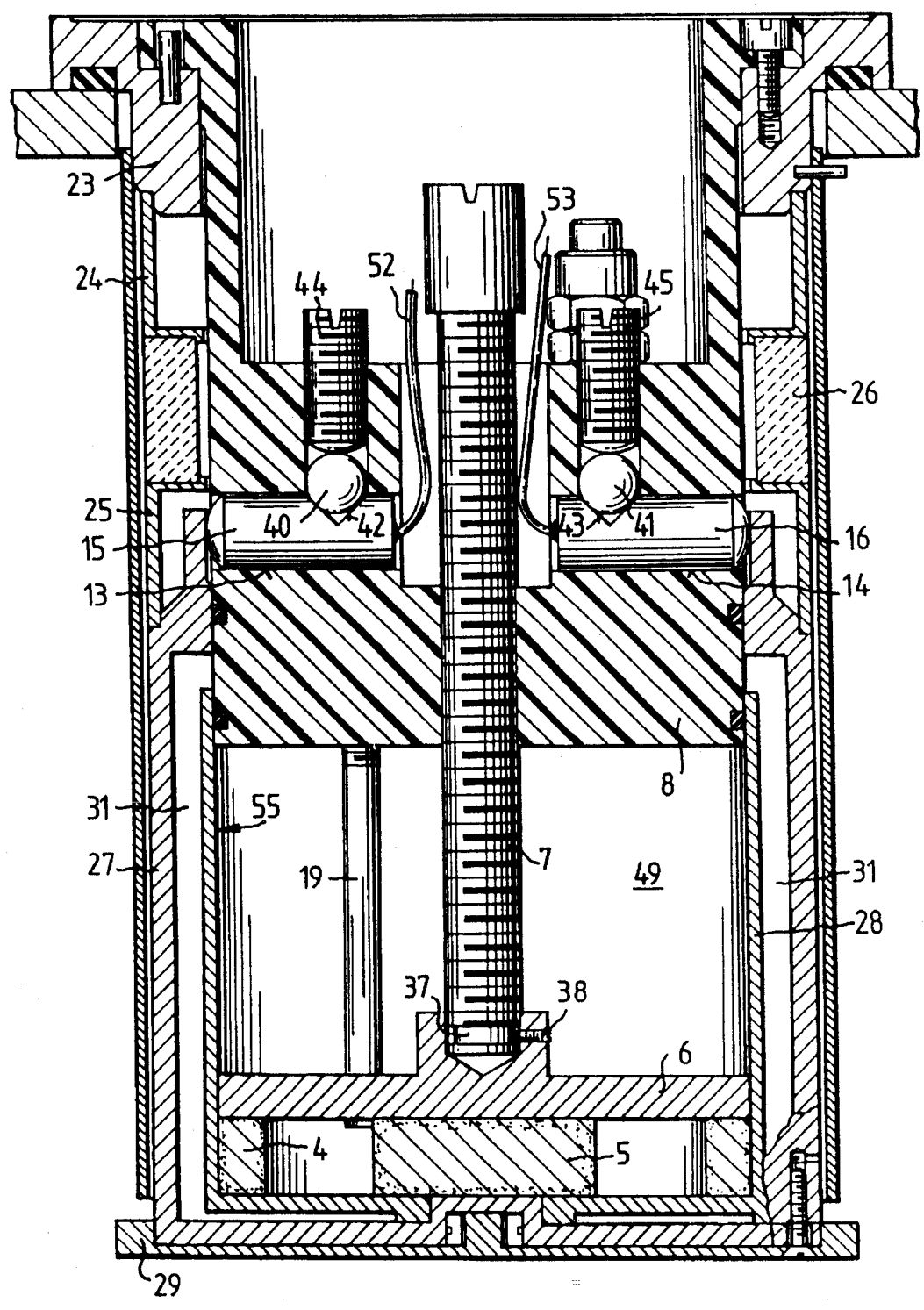
Figure 3:
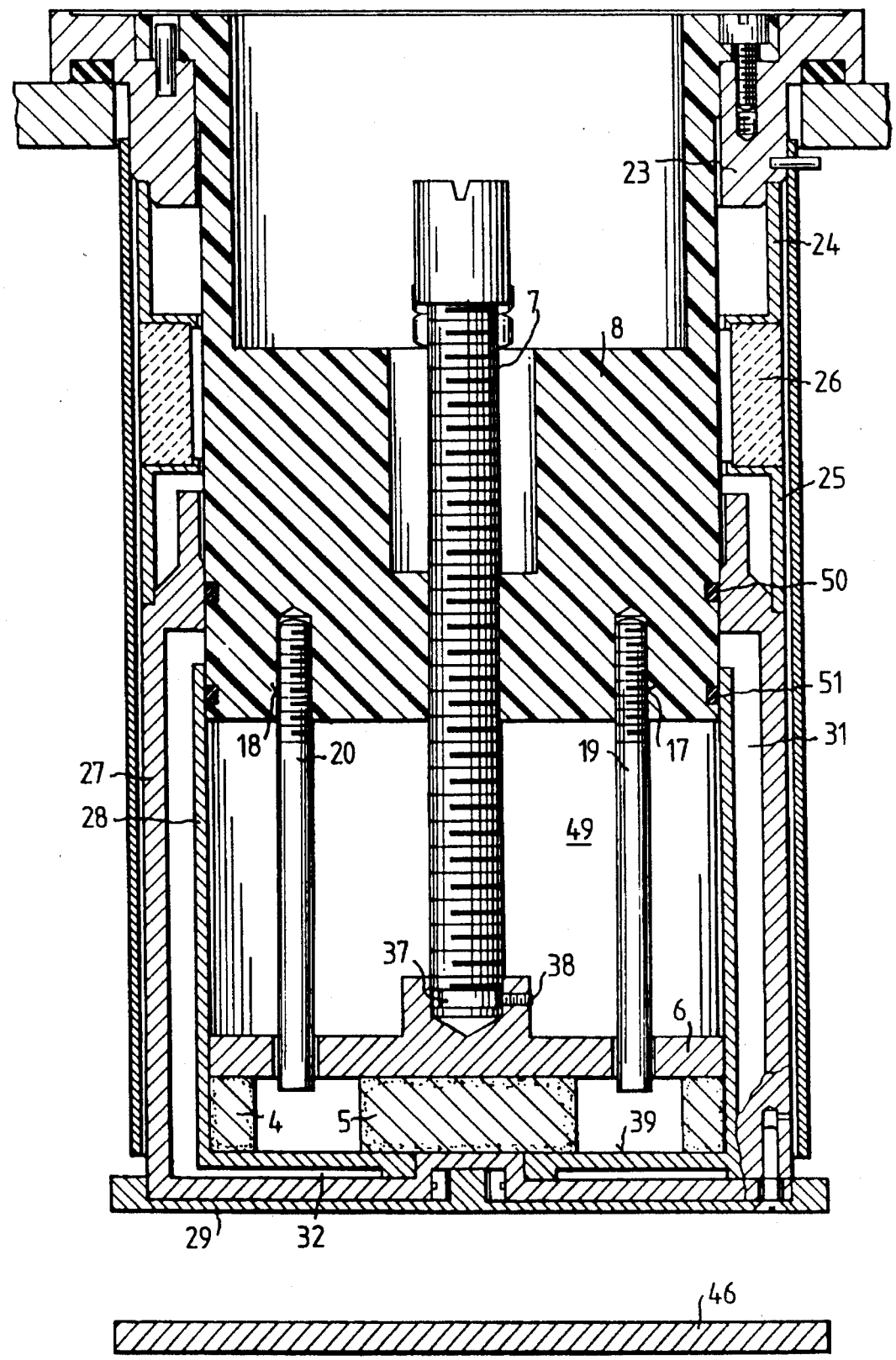
Figure 4:
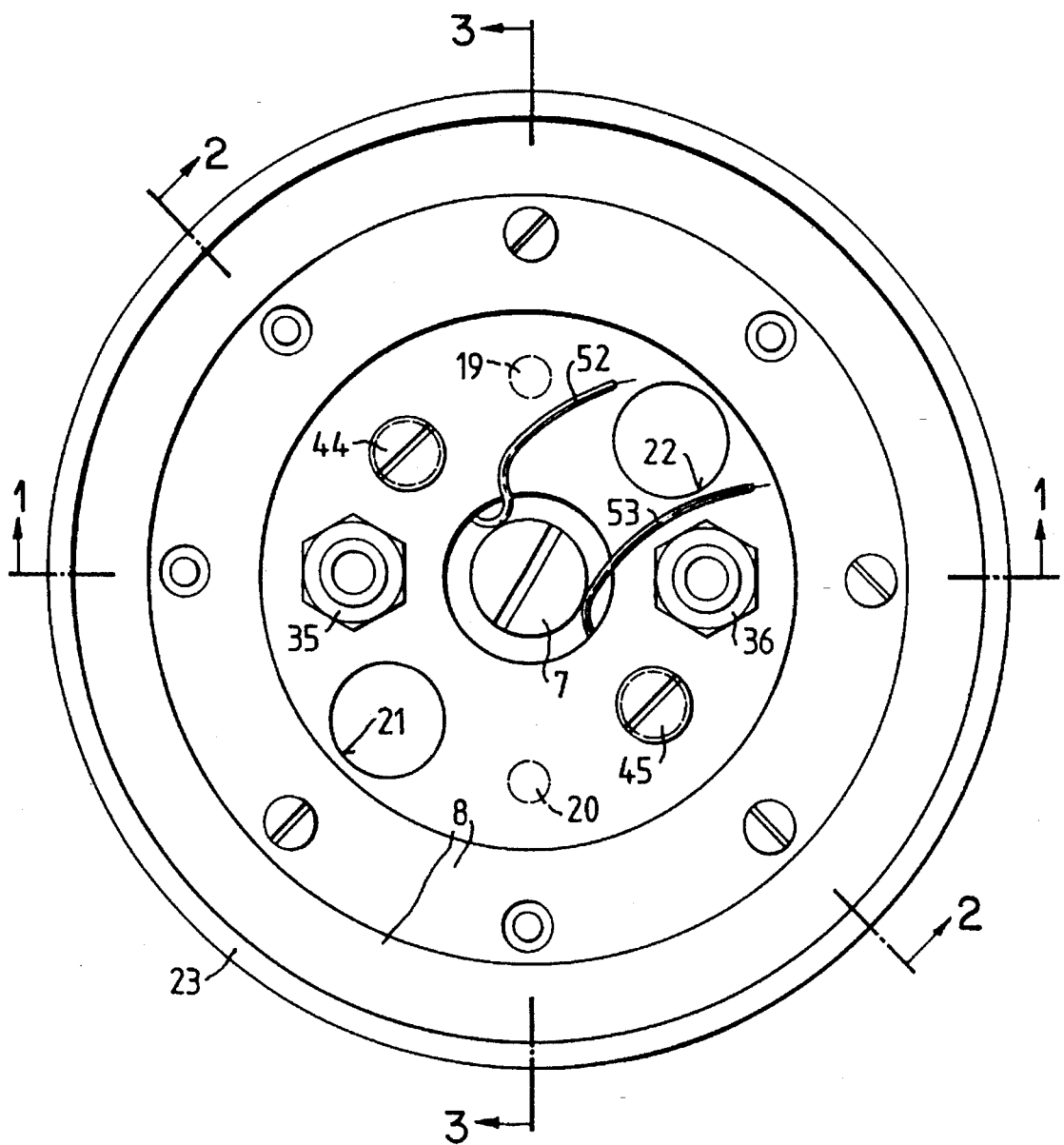

FIG. 2 is another longitudinal section through the cathode of FIG. 1, but along a second plane (section D—D in FIG. 4), FIG. 3 is an additional longitudinal section along a third plane (section E—E in FIG. 4), FIG. 4 is a top view of the cathode according to FIGS. 1 to 3, and FIG. 5 shows diagrammatically a longitudinal section through the sputtering cathode with target screwed on, and through a plane having the cooling passages and the coolant connections.

The cathode consists essentially of a pot-like housing 3 formed of several parts, two permanent magnets 4 and 5 held in the bottom of the pot-like housing 3 and having a circular disk-shaped magnet yoke 6 and a raising spindle 7 screwed into the thick bottom of a likewise pot-like plastic insert 8 (FIG. 1) and which contains the connections 9 and 10 for the cooling passages 11 and 12, the bores 13 and 14 for the electrical contact pins 15 and 16 (FIG. 2), the threaded bores 17 and 18 for the two guiding rods 19 and 20 (FIG. 3) and lastly the two openings 21 and 22 (FIG. 4) for the connecting cable of an electromagnet (which is not represented in detail). The plastic insert 8 preferably is of the electrical insulating plastic PEEK G with a through resistance of $4.9 \times 10^{16}$ ohm-cm, manufactured by the firm Polypenco.

The pot-like housing 3 has a flange 23 for mounting the cathode on the wall 30 of the process chamber, the two rings 24 and 25, the ceramic ring 26 disposed between the two rings 24 and 25, the outer shell 27 and the inner shell 28, and the target 29.

As can be seen in FIG. 1, the two shells 27 and 28 are disposed concentrically with one another and are of such a size that they form annular cavity 31 and likewise an approximately disk-shaped cavity 32 at the bottom 39 of the housing 3, attached to the target 29. These cavities 31 and 32 correspond with connecting bores 33 and 34, respectively, which are provided in the insert 8 and which in turn are connected to the cooling passages 11 and 12 which are again connected by the threaded fastenings or connections 9 and 10 to the coolant lines 35 and 36.

FIG. 3 shows that the magnet yoke 6 is joined to the bottom end of the raising spindle 7 by a pin 38 such that, when the raising spindle 7 is turned, the yoke 6 can be raised or lowered, depending on the direction of turning, while at the same time the yoke 6 is prevented from turning with it by means of the guiding rods 19 and 20. By raising or lowering the magnet yoke 6 and the permanent magnets 4 and 5 affixed thereto, the parameters of the coating process can be controlled in a known manner. The thread 56 even when the raising spindle 7 screwed therein does not form a vacuum-tight seal with the spindle 7 and this allows equalization of pressure between the interior 49 and the outside air.

The openings 21 and 22 seen in FIG. 4 permit the installation—though this is not shown—of an electromagnet instead of the permanent magnets 4 and 5 with their corresponding magnet yoke 6. In this case the yoke 6 with its magnets 4 and 5 fastened thereon, the raising spindle 7 and the guiding rods 19 and 20, are disassembled in order then to be able to insert an electromagnet with a preferably cylindrical configuration into the space 49 between the insert 8 and the bottom 39 of the housing. The openings 21 and 22 in insert 8 serve in this case as lead-throughs for the power lines of the electromagnet.

The cathode described above has the advantage that the cooling jacket formed by cavities 31 and 32 is on the outside, while the coolant connections 9 and 10 are on the inside, so that any leakage in the coolant line cannot lead to an irruption of coolant into the process chamber 2. The coolant connections can also easily be released from the threaded fastenings or connections 9 and 10 without the need to let air into the process chamber 2.

Furthermore, the magnet sets can be replaced while the process chamber is evacuated, and the distance between the magnets and the target 29 can be varied without the need to open the process chamber 2. To heat up a UHV version of the cathode, the insert 8 and the magnet set 4, 5, 6 fastened thereto can easily be removed from the cathode rearwardly or upwardly.

It is also to be noted that the power feed 52 and 53 to the shells 27 and 28 and to the target 29 is performed through the contact pins 15 and 16 seen in FIG. 2, which are forced outward by means of balls 40 and 41, which engage notches 42 and 43 and are in contact with set screws 44 and 45 or are held by them under bias. By tightening the set screws 44 and 45 the pins 15 and 16 are forced radially outward to such a degree as to assure the reliable passage of current between the contact pins 15 and 16 and the shell 27.

The insert 8 is lastly sealed against the inside wall of the housing 3 by the O-rings 50 and 51 so that the coolant can enter the cavity or interstice 31 only from the connecting bores 33 and 34. The inner shell 28 is for this purpose permanently joined to the outer shell 27, for example by welding, so that in the event of a leak at the O-rings 50 and 51 no coolant can penetrate into the coating chamber.

Figure 5:
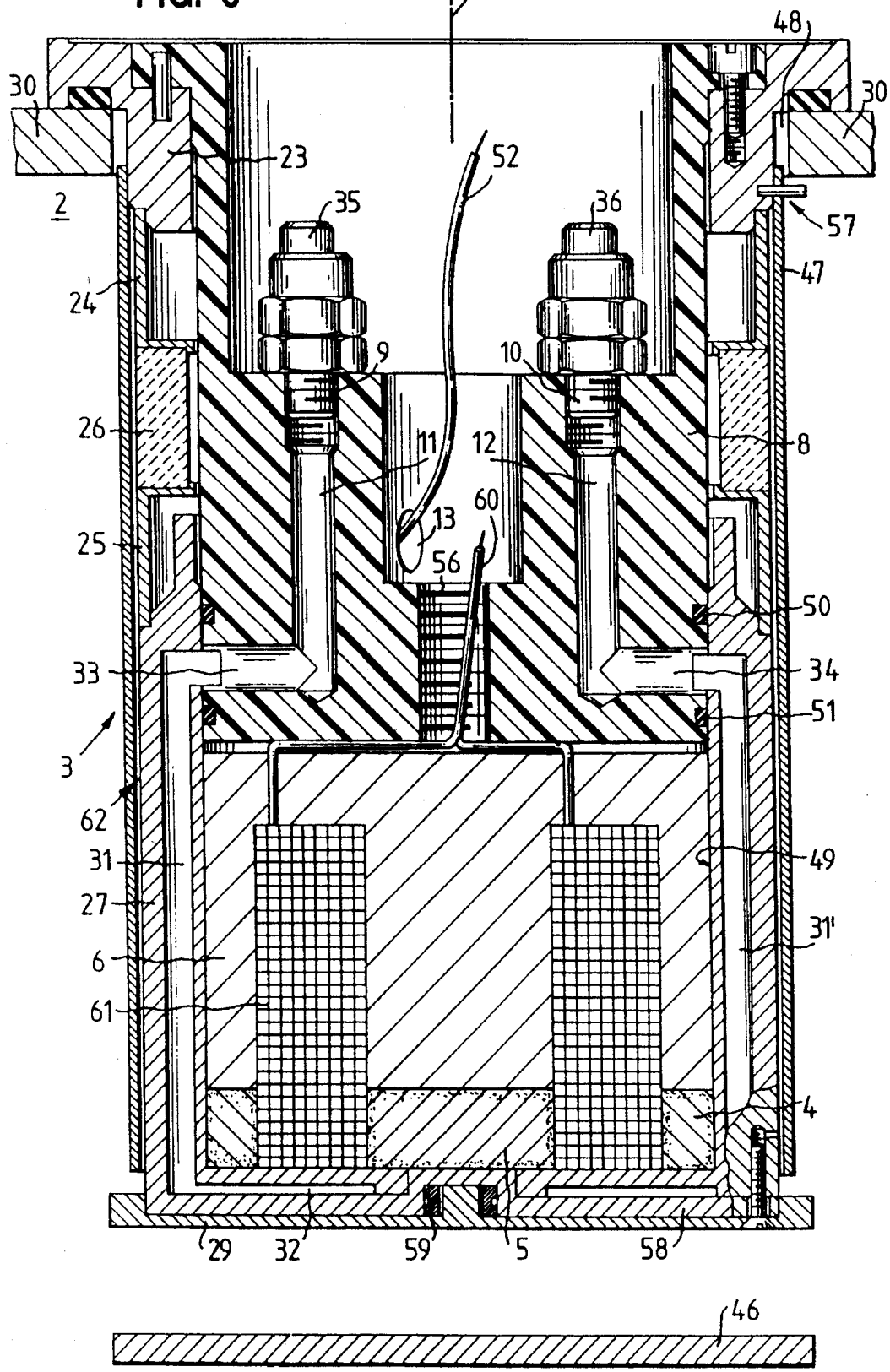

Referring to FIG. 5, the cathode disposed opposite the substrate 46 consists essentially of a pot-like housing 3 formed of several parts, two permanent magnets 4 and 5 held in the bottom of the pot-like housing, one of which has a cylindrical configuration, with an approximately cylindrical magnet yoke 6, with the coil or electromagnet 61 of cylindrical shape inserted therein, a pot-like insert 8 which contains the connections 9 and 10 for the cooling passages 11 and 12 and the bore 56 for the connecting cable 60 for the electromagnets 61, and which can be locked to the housing 3 by means of radially adjustable bolts not represented in detail.

The pot-like housing 3 consists of a flange 23 for mounting the cathode on the wall 30 of the process chamber, the two rings 24 and 25, the ceramic ring 26 disposed between the two rings 24 and 25, the water-cooled outer shell 27, the soldered-on bottom plate 58, the target 29 and the soldered-in threaded sleeve 59.

As it can be seen from FIG. 5, the bores 31, 31', . . . , pass through the cylindrical body and in the cavity 32 they connect the cooling circuit between inlet and return. These bores 31, 31' . . . , and these cavities 32 correspond with connecting bores 33 and 34, respectively, which are provided in the insert 8 and which are connected in turn with the coolant passages 11 and 12 which in turn are joined by the screw connections the coolant lines 35 and 36. The bore or opening 56 permits installation of an electromagnet 61 with the corresponding yoke 6.

The cathode of FIG. 5 has the advantage that the cooling jacket or cavities 31, 31', . . . , and 32 through which coolant flows are on the outside, while the coolant connections 9 and 10 are inside, so that leakage in the coolant feed line cannot lead to an irruption of coolant into the process chamber 2. The coolant connections can also be easily be disconnected from the threaded connections or connection posts 9 and 10 without having to vent the process chamber 2.

Further, the magnet insert can be replaced while the process chamber 2 is evacuated, and the distance between the magnets 4 and 5 and the target 29 can be changed without the need to open or flood the process chamber 2. To heat up the cathode, the insert 8 and the magnet set 4, 5, 6 and 61 fastened to it, can be easily removed rearwardly or upwardly from the cathode.

The power input 52 to the shell 27 and to target 29 is performed through the above-mentioned radially adjustable bolts which are held under bias and urged radially outward (not represented), so that a reliable transfer of current between the bolts and the shell is assured.

The high-frequency-resistant insert 8 is lastly sealed against the inside wall of the housing 3 by means of O-rings 50 and 51 such that the coolant can enter into the cavity or interstice 32 or bores 31, 31', only from the connecting bores 33, 34.

The bottom plate 58 is vacuum soldered to the cylindrical part 27 at all points of contact. A threaded sleeve 59 is soldered into the bottom plate 58 for the purpose of mounting the target.

Lastly, the housing 3 of the cathode is surrounded by a tubular dark-space shield 47 which is fastened to flange 23 by means of a bayonet lock 57, and that parts 23 and 24 and parts 25 and 27 are joined to one another by welding and parts 24 and 26, and 26 and 25, are fastened together by hard soldering, and that the flange 23 of the housing is screwed to the collar extending radially outward from the insert 8.

While there have been described what are at present considered to be the preferred embodiments of this invention, it will be obvious to those skilled in the art that various changes and modifications may be made therein without departing from the invention, and it is, therefore, aimed to cover all such changes and modifications as fall within the true spirit and scope of the invention.

What is claimed is:

1. Cathode system for coating a substrate, comprising:

a voltage source;

an evacuable coating chamber having an outside wall having an opening;

a cathode connected to said voltage source and disposed in the evacuable coating chamber;

a target electrically connected to the cathode and which is sputtered and whose sputtered particles deposit themselves on a substrate and a process gas brought into the coating chamber;

the cathode comprising a substantially pot-like housing having a solid bottom and having an outer face fixedly joined to the target and the housing having an open end which is sealingly held in the opening in the outside wall of the coating chamber, the housing having an interior being always exposed to atmospheric pressure, while the target and the outer face of the housing joined to the target and reaching into the coating chamber are exposed to the pressure prevailing in the coating chamber;

the pot-like housing being of double-walled construction section-wise having inside and outside walls forming a cavity;

coolant lines and line connections;

an insert having cooling passages, and having coolant lines and line connections communicating with the passages and communicating with the cavity, one of the walls of the insert having a radially outer wall portion;

the interior having an inner wall portion surrounding the outer wall portion of the insert; and O-rings sealing the insert against the inside wall of the housing.

2. Cathode system according to claim 1, in which cooling passages extend on the one hand into cooling passages which run parallel to a longitudinal axis of the housing and correspond with coolant lines through which coolant is fed to and away from the cathode, the insert having a threaded bore in the longitudinal direction of the housing, a set of permanent magnets and a yoke, a raising spindle cooperating with the threaded bore and having a target-related end joined to the yoke 6 by which the yoke is displaceable longitudinally of the housing.

3. Cathode system according to claim 2, in which the insert has bores running transversely of the longitudinal axis of the housing;

the housing having an inside wall;

contact pins having radially outer ends each in contact with the inside wall of the housing and having opposite ends connected each to electrical conductors, the bores holding and guiding the contact pins, the insert being made of an electrically insulating ceramic material.

4. Cathode system according to claim 1, in which the housing has a flange which is joined to the outside wall of the coating chamber, an annular intermediate piece fixedly joining the flange to the housing having the target, the intermediate piece being made of an electrically insulating ceramic material.

5. Cathode system according to claim 4, which includes a tubular dark-space shield and a bayonet lock and in which the flange of the housing, which is joined to the outside wall of the coating chamber, is coupled to the tubular dark-space shield by a bayonet lock.

6. Cathode system for coating a substrate, comprising:

a voltage source;

an evacuable coating chamber having an outside wall having an opening;

a cathode connected to said voltage source and disposed in the evacuable coating chamber;

a target electrically connected to the cathode and which is sputtered and whose sputtered particles deposit themselves on a substrate; and a process gas brought into the coating chamber;

the cathode comprising a substantially pot-like housing having a solid bottom and having an outer face affixed to the target and the housing having an open end which is sealingly held in the opening in the outside wall of the coating chamber, the housing having an interior being always exposed to atmospheric pressure, while the target and the outer face of the housing joined to the target and reaching into the coating chamber are exposed to the pressure prevailing in the coating chamber;

an insert at least partially filling an interior of the housing, which is locked on the housing such that it forms with the bottom an approximately cylindrical chamber;

a magnet set including an electromagnet and a yoke inserted in the approximately cylindrical chamber;

the pot-like housing being of double-walled construction section-wise having inside and outside walls forming a cavity;

coolant lines and line connections;

an insert having cooling passages, and having coolant lines and line connections communicating with the passages and communicating with the cavity, one of the walls of the insert having a radially outer wall portion;

the interior having an inner wall portion surrounding the outer wall portion of the insert; and O-rings sealing the insert against the inside wall of the housing.

7. Cathode system according to claim 6, in which the magnet set includes permanent magnets formed of a cylindrical magnet and a cylindrical magnet surrounded ring-wise thereby, an annular chamber formed by the two magnets, the electromagnet having a cylindrical winding reaching with an end facing the bottom of the housing into the annular chamber formed by the two magnets, an end of the coil of the electromagnet facing away from the bottom being set into a recess adapted therefor in the yoke.

8. Cathode sputtering apparatus comprising a cathode comprising a pot-shaped outer shell and an inner shell, said outer shell having a central axis and a solid bottom, said inner shell being located concentrically in said outer shell and fixed thereto, said inner shell and said outer shell defining an annular cavity therebetween, an insert fixed sealingly in said inner shell and said outer shell, said insert having formed therein coolant passages which communicate with said annular cavity, and a target fixed to said solid bottom opposite from said inner shell.

9. Apparatus as in claim 8 wherein said inner shell and said insert define an interior space of said cathode, said insert having therethrough a threaded bore which parallels said axis, said apparatus further comprising a magnetic yoke in said interior and a spindle passing through said threaded bore, said spindle being axially connected to said magnetic yoke for moving said yoke relative to said cathode.

10. Apparatus as in claim 8 wherein said insert is made of electrically insulating material.

11. Apparatus as in claim 8 further comprising a coating chamber having a wall with a flange in which said cathode is fitted, and insulating means for electrically isolating said cathode form said wall.

12. Apparatus as in claim 11 further comprising a tubular dark space shield fixed to said flange and surrounding said cathode.

13. Apparatus as in claim 8 wherein said insert has radical bores extending transversely of said central axis, and said bores containing contact pins in electrical contact with said cathode for supplying a voltage thereto.

14. Apparatus as in claim 8 further comprising an O-ring seal between said insert and said inner shell and an O-ring seal between said insert and said outer shell, said coolant passages communicating with said annular cavity between said O-rings.

15. Apparatus as in claim 8 wherein said inner shell and said insert define an interior of said cathode, said coolant passages communicating said annular cavity above said interior space and without passing through said interior space.

* * * * *